United States Patent
Naem

Patent Number: 5,843,834
Date of Patent: Dec. 1, 1998

[54] SELF-ALIGNED POCL₃ PROCESS FLOW FOR SUBMICRON MICROELECTRONICS APPLICATIONS USING AMORPHIZED POLYSILICON

[75] Inventor: Abdalla A. Naem, Sunnyvale, Calif.

[73] Assignee: National Semiconductor Corporation, Santa Clara, Calif.

[21] Appl. No.: 689,334

[22] Filed: Aug. 8, 1996

[51] Int. Cl.⁶ ................................................. H01L 21/225
[52] U.S. Cl. ............................ 438/564; 438/305; 438/633
[58] Field of Search ....................................... 438/303, 305, 438/558, 564, 626, 633, 645

[56] References Cited

U.S. PATENT DOCUMENTS

| | | | |
|---|---|---|---|
| 5,624,863 | 4/1997 | Helm et al. | 438/564 |
| 5,637,525 | 6/1997 | Dennison | 438/564 |
| 5,693,550 | 12/1997 | Torii | 438/303 |

*Primary Examiner*—Chandra Chaudhari
*Attorney, Agent, or Firm*—Limbach & Limbach L.L.P.

[57] ABSTRACT

In a method of introducing phosphorous into an undoped gate polysilicon region formed as part of an integrated circuit structure, an initial MOS structure is developed utilizing conventional techniques through the lightly doped drain (LDD) implant step, with the exception, that, in this case, the gate polysilicon remains undoped. In accordance with the invention, dopant is then implanted into the source/drain regions such that the undoped gate polysilicon is amorphized, thereby eliminating the polysilicon grain boundaries. A CVD oxide layer is then formed and a CMP step is performed to expose the amorphized gate polysilicon region. A phosphorous oxychloride (POCl₃) layer is then formed over the amorphized gate polysilicon and thermally annealed to drive phosphorous from the POCl₃ layer into the polysilicon. The POCl₃ layer is then removed.

3 Claims, 5 Drawing Sheets ized gate polysilicon. A POCl₃ layer is then formed over the amor-
SELF-ALIGNED POCL₃ PROCESS FLOW FOR SUBMICRON MICROELECTRONICS APPLICATIONS USING AMORPHIZED POLYSILICON

BACKGROUND OF THE INVENTION

1. Field of the Invention

The present invention relates to fabrication techniques for integrated circuit structures and, in particular, to a self-aligned process flow for thermally driving phosphorous from a phosphorous oxychloride (POCl₃) layer into underlying polysilicon to establish a desired conductivity level in the polysilicon.

2. Discussion of Related Art

In the manufacture of semiconductor integrated circuits, it is common to utilize doped polysilicon to provide conductive gate structures for MOS devices. Typically, the polysilicon gate is doped to a desired conductivity level by forming an overlying layer of phosphorous oxychloride (POCl₃) and then annealing the POCl₃ layer to drive the phosphorous into the polysilicon.

A typical POCl₃ process flow is illustrated in FIGS. 1A–1F.

FIG. 1A shows the initial device structure through deposition of the undoped gate polysilicon layer 100. As shown in FIG. 1B, a layer of POCl₃ film 102 is then deposited over the polysilicon 100. Next, as shown in FIG. 1C, a POCl₃ anneal step is performed to drive phosphorous from the POCl₃ film 102 into the underlying polysilicon to form a doped polysilicon layer 104. Following the POCl₃ anneal step, a deglazing step is performed using DI-HF (10:1) etching solution to remove the POCl₃ layer.

During the POCl₃ anneal step, when the phosphorous is driven from the POCl₃ into the polysilicon, most of the phosphorous segregates into the polysilicon grain boundaries and forms heavily doped phosphorous oxide, which etches very fast in HF solutions. Also during the POCl₃ deposition, a thin (100–200 Å) phosphorous-rich organic layer is formed on the surface of the POCl₃ layer. This phosphorous-rich organic layer must be removed before the wet HF solution can be effectively used to remove the POCl₃ layer underneath. Because the surface layer is not of uniform consistency, the wet DI:HF solution will reach the POCl₃ layer through holes formed in the phosphorous-rich layer. The HF will take longer to remove the POCl₃ layer because of the masking caused by the phosphorous-rich layer. This will allow the HF, in some areas where the etching went faster, to penetrate into the grain boundaries in the polysilicon, remove the heavily doped oxide, and reach the underlying thin gate oxide layer 108. When the HF solution penetrates the polysilicon layer 104 and reaches the thin gate oxide layer 108, it attacks the gate oxide, forming holes 106 and, therefore, polysilicon-to-substrate shorts, as shown in FIG. 1D.

Referring to FIG. 1E, following the POCl₃ deglaze step, a gate polysilicon photomasking step, required for patterning the gate polysilicon film 104, is performed to define a patterned photoresist layer 110 on the doped polysilicon 104. As shown in FIG. 1F, the gate polysilicon 104 is then etched and the photoresist 110 is removed to define the polysilicon gate 112 of the MOS device.

However, during the polysilicon etch step, oxide residue "pillars" 114 are generated on the field/source/drain oxide areas. That is, during polysilicon patterning, the oxide present at the polysilicon grain boundaries in areas where the HF solution did not penetrate will not be attacked by the polysilicon etch and, hence, will remain on the field oxide and on the source/drain oxide, forming what are commonly referred to as oxide "pillars." These pillars present severe reliability hazards for the final product.

FIG. 1F shows the final polysilicon gate structure obtained by the conventional process flow, including the polysilicon-to-substrate shorts through the holes in the gate oxide as well as the oxide pillars formed on the field and source/drain oxide.

Thus, although the conventional POCl₃ process flow is adequate for large geometry dimensions, where the gate oxide is thick enough (i.e., greater than 200 Å) to withstand attack by the HF deglaze solution and the product is not sensitive to oxide residues left on the surface of the thermal oxides, in ULSI processes, the conventional POCl₃ process is not adequate because of the small dimensions of the device, which require high degrees of cleanliness and thin gate oxides (i.e., less than 100 Å).

SUMMARY OF THE INVENTION

The present invention provides a new method of introducing phosphorous into undoped gate polysilicon from phosphorous oxychloride (POCl₃). In accordance with the method, an initial MOS structure is developed utilizing conventional techniques up to the lightly doped drain implant step, with the exception, that, in this case, the gate polysilicon layer remains undoped. In accordance with the invention, dopant is then implanted into the substrate to form the source/drain regions of the MOS device and, simultaneously, to amorphize the undoped gate polysilicon, thereby breaking the grain boundaries and mixing the oxide with the silicon. An oxide layer is then formed by chemical vapor deposition (CVD) and a chemical mechanical polishing (CMP) step is performed to expose the amorphized gate polysilicon. A POCl₃ layer is then formed over the amorphized gate polysilicon and thermally annealed to drive phosphorous from the POCl₃ layer into the polysilicon. The POCl₃ layer is then removed without the resultant gate oxide holes and oxide pillars experienced when the conventional process flow is utilized, since removal of the grain boundaries facilitates more uniform etching of the polysilicon.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

A process flow for doping polysilicon using phosphorous oxychloride (POCl₃) in accordance with the present invention will now be described in conjunction with the partial cross-sectional drawings provided in FIGS. 2A–2I. While no specific process parameters (e.g. film thicknesses, dopant concentrations, etc.) are provided, those skilled in the art will appreciate that the concepts of the invention are applicable regardless of these parameters, which will differ depending upon the specific integrated circuit product under manufacture. Those skilled in the art will also appreciate that, while the following discussion is directed to the fabrication of N-channel devices, the concepts of the invention apply to all MOS technologies and, in fact, to all process flows that utilize phosphorous-doped polysilicon.

Figure 1A:
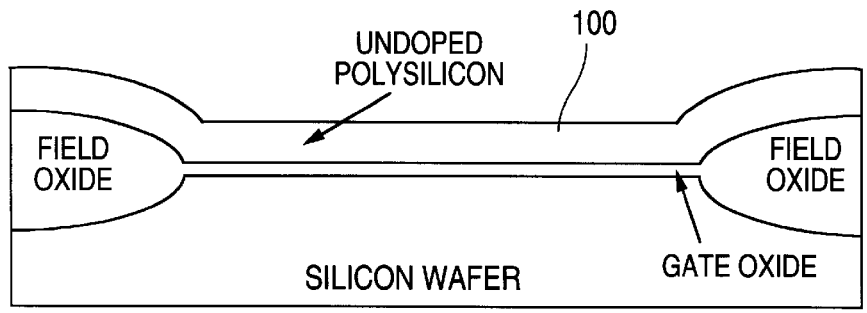
FIGS. 1A–1F are partial cross-sectional drawings of a semiconductor structure illustrating the sequential steps of a conventional POCl₃ process flow.
Figure 1B:
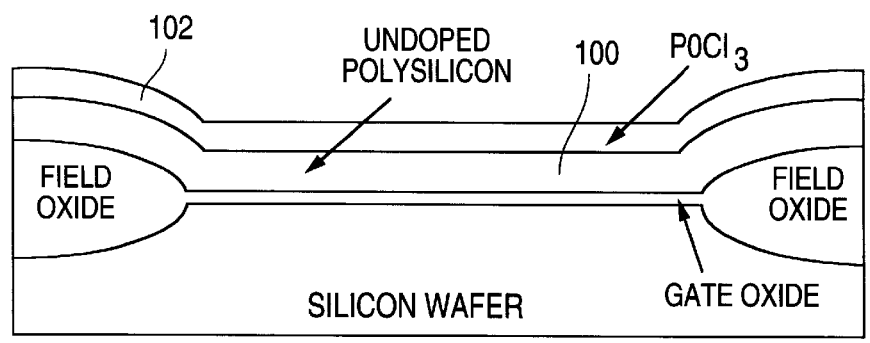
Figure 1C:
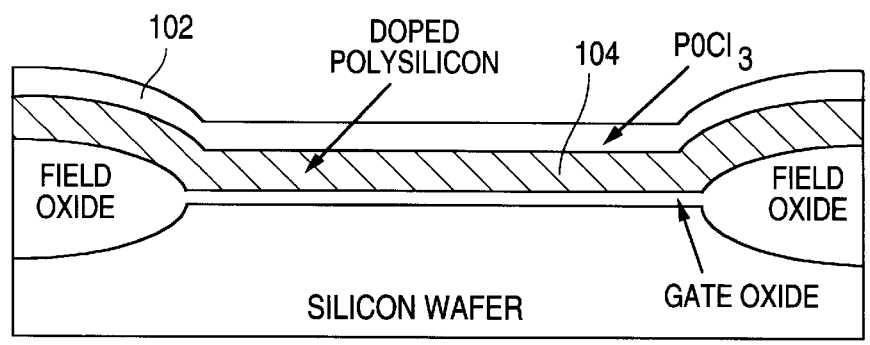
Figure 1D:
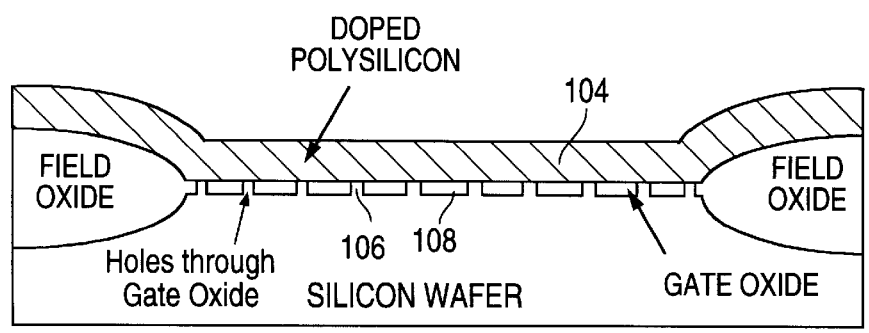
Figure 1E:
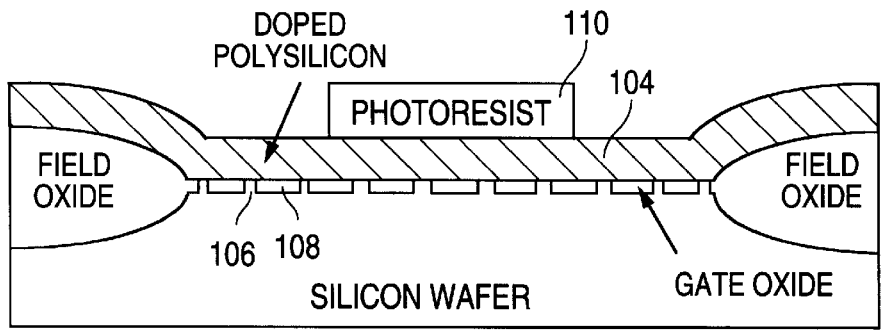
Figure 1F:
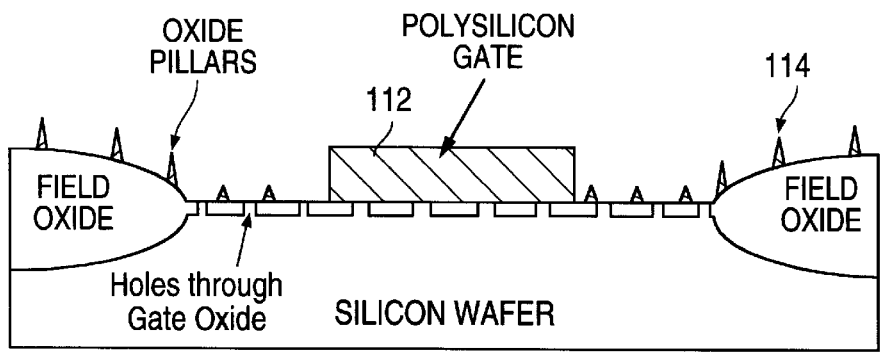
Figure 2A:
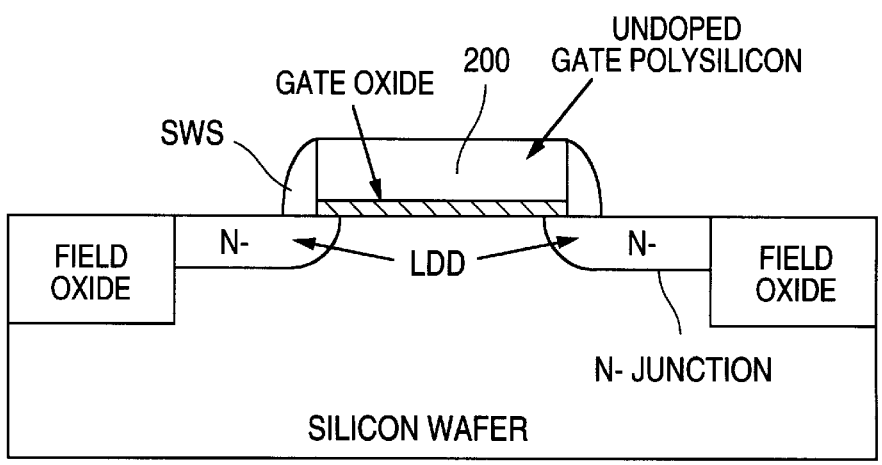
FIGS. 2A–2I are partial cross-sectional drawings of a semiconductor integrated circuit structure illustrating the sequential steps of a POCl₃ process flow in accordance with the present invention.

Referring to FIG. 2A, an initial MOS structure is developed utilizing conventional techniques through the lightly doped drain (LDD) implant step, with the exception that, in this case, the gate polysilicon 200 remains undoped and the field oxide is formed using trench isolation instead of LOCOS (local oxidation of silicon) techniques.

Figure 2B:
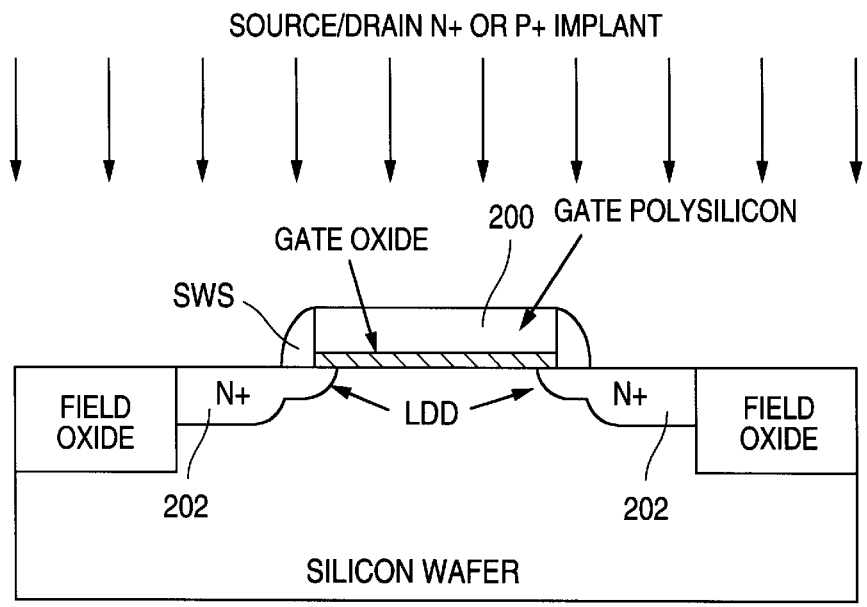

Next, depending upon whether an N- or P-channel device is being fabricated, an N+ or P+ source/drain implant step is performed to form the conventional source and drain areas 202, as shown in FIG. 2B. Also, in accordance with the invention, this implant step amorphizes the gate polysilicon 200 and, therefore, destroys the grain boundaries in the structure of the gate polysilicon 200 that are susceptible to attack by HF deglaze solution, as discussed above.

Figure 2C:
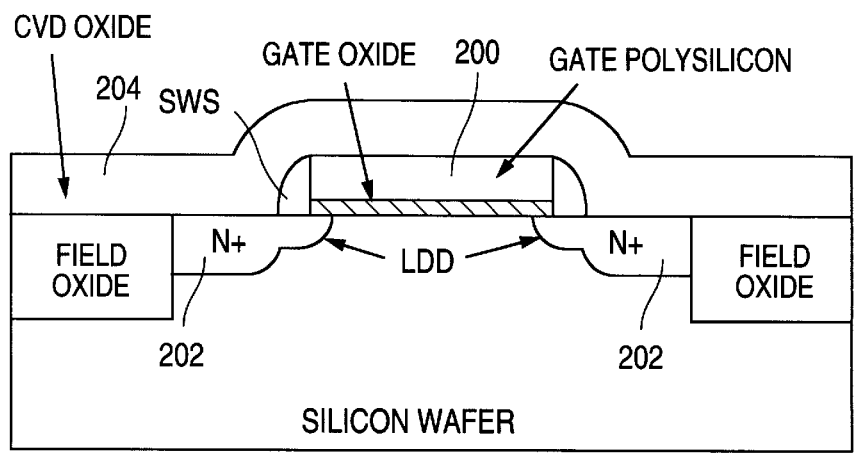

Next, a layer of silicon dioxide 204 is formed, for example, by chemical vapor deposition (CVD), resulting in the structure shown in FIG. 2C.

Figure 2D:
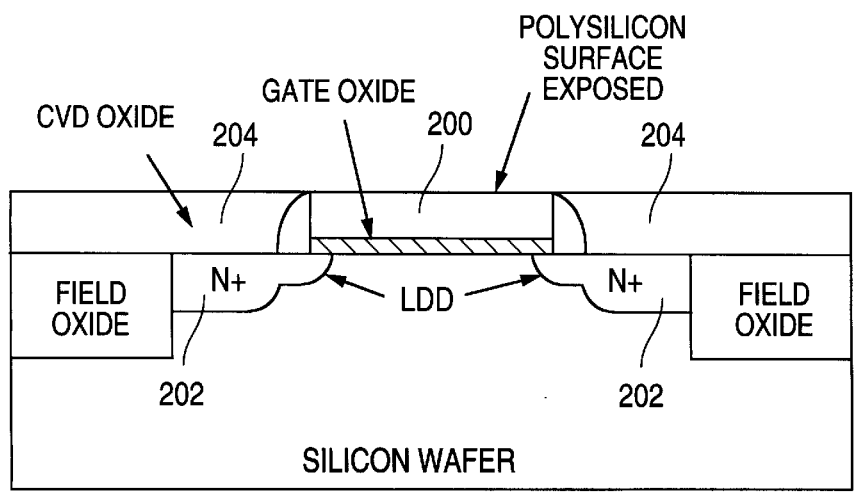

Referring to FIG. 2D, a conventional chemical mechanical polishing (CMP) step is then performed to expose the polysilicon gate 200, while all other silicon areas remain protected by the CVD oxide 204. Also, the CMP step planarizes the surface of the entire device and, therefore, reduces the overall structure topography. The initial thickness of the polysilicon gate material in this case must be slightly thicker than the conventional poly process (about 0.5 micron instead of 0.3 micron). This insures that all polysilicon areas are exposed when the polysilicon gate layer 200 is thinned down to 0.3 micron after the CMP step.

Figure 2E:
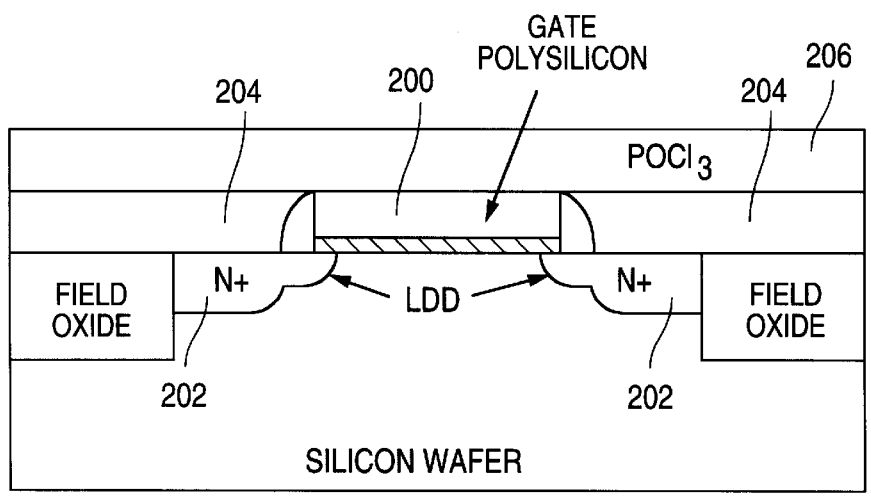
Figure 2F:
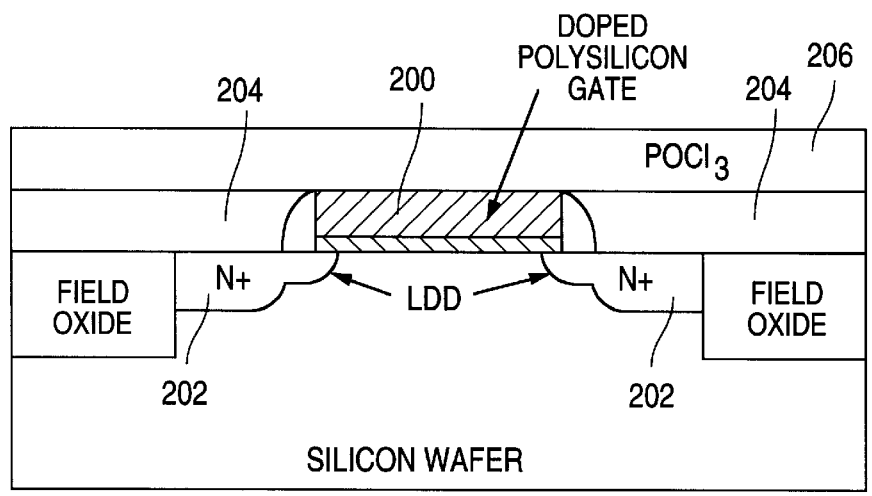

Next, as shown in FIG. 2E, a phosphorous oxychloride ($POCl_3$) film 206 is deposited over the entire structure. As discussed above, the formation of the $POCl_3$ layer results in the formation of a phosphorous-rich organic layer (not shown) on the upper surface of the $POCl_3$. The $POCl_3$ film 206 is then thermally annealed to drive the phosphorous into the gate polysilicon 200. The $POCl_3$ anneal is performed as a conventional step, except that, as stated above, as a result of the source/drain implant step, the phosphorous is being driven into amorphous silicon rather than into a polysilicon film. The resulting structure is shown in FIG. 2F.

Figure 2G:
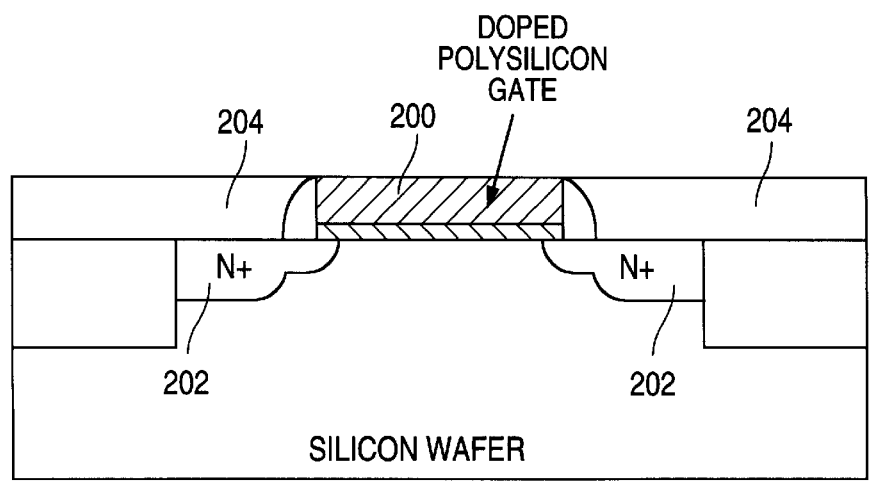

Next, the $POCl_3$ layer 206 is removed in a deglazing step using DI-HF (10:1), resulting in the structure shown in FIG. 2G without the gate oxide holes and the oxide residue experienced when the conventional process flow is utilized.

Figure 2H:
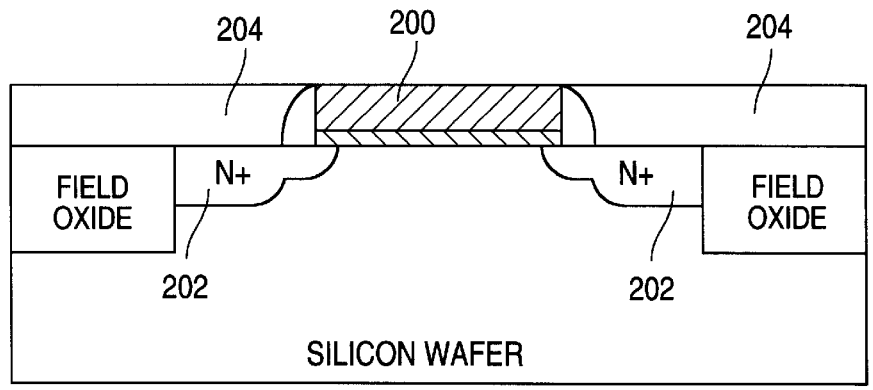

As shown in FIG. 2H, a rapid thermal process (RTP) anneal step is then performed to activate the source/drain implants as well as the doping in the gate polysilicon 200.

Figure 2I:
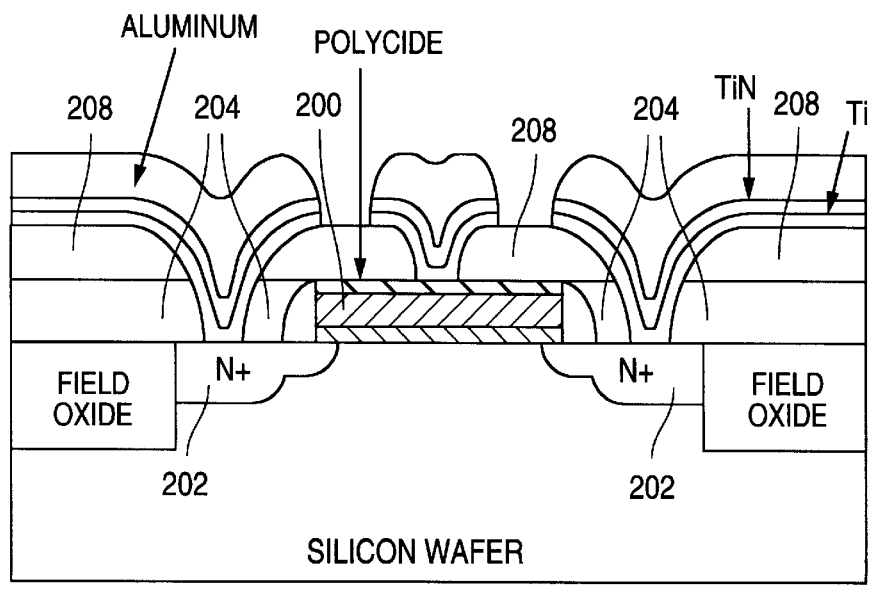

Then, a dielectric oxide layer 208 is deposited and contacts are opened and a metallization flow module, in the illustrated case, the formation of a Ti/TiN/Al film, are performed in the conventional manner, resulting in the structure shown in FIG. 2I.

Alternatively, as shown in FIG. I, a polycide layer can be formed on the gate polysilicon 200 to improve the contact. Formation of the polycide layer could proceed according to the following steps: A layer of titanium is formed over the FIG. 2H structure. A low temperature RTP step is then performed to form a first phase silicide on the gate poly 200. The unreacted titanium is then removed in a wet strip and a high temperature RTP step is performed to form a low resistance polycide. Thus, polycide is formed on heavily doped $POCl_3$ polysilicon while the source/drain regions 202 are protected from the high temperatures experienced during the second phase RTP step.

The new $POCl_3$ process flow described above includes a number of advantageous features. First, the gate areas are patterned before any polysilicon doping. Also, the traditional LDD and N+/P+ source/drain implants are performed before the gate $POCl_3$ doping is carried out. The source/drain implant amorphizes the gate polysilicon, destroying the grain boundaries in the polysilicon and, therefore, preventing dopant channeling and/or dopant desegregation to grain boundaries during $POCl_3$ deposition or drive in. The CMP step is performed after the first dielectric layer is deposited to a degree that exposes the polysilicon gates everywhere on the wafer. The $POCl_3$ film is deposited after the first dielectric layer and CMP steps are performed. The $POCl_3$ film is now self-aligned to the gate polysilicon and, therefore, the $POCl_3$ process will not affect any other areas on the wafer, such as the field or source/drain oxides. The deglazing step, i.e., the removal of the $POCl_3$ film, becomes optional on this process flow because the $POCl_3$ layer is isolated from the device active areas and, thus, will not affect the device. Additionally, this process flow eliminates the oxide "pillars" normally seen on the field/source/drain oxides after the polysilicon etch. The process flow also eliminates the holes sometimes detected in the gate oxide because the $POCl_3$ is performed on grain boundary-less amorphized silicon and, therefore, there is no chance for any wet etchant used in the deglazing to reach the gate oxide.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of introducing phosphorous into a polysilicon region formed as part of an integrated circuit structure, wherein the polysilicon region overlies silicon oxide formed on a semiconductor substrate between field oxide regions formed in the semiconductor substrate, the method comprising:

(a) amorphizing the polysilicon region;

(b) forming a silicon oxide layer over the structure resulting from step (a);

(c) performing a chemical mechanical polishing (CMP) step to expose an upper surface of the amorphized polysilicon region;

(d) forming a layer of source material including phosphorous oxychloride ($POCl_3$) over the structure resulting from step (c);

(e) thermally annealing the layer of source material to drive phosphorous from the layer of source material into the underlying amorphized polysilicon region; and (f) removing the layer of source material.

2. A method of forming an MOS transfer in a semiconductor substrate, the method comprising:

(a) forming trench isolation field oxide regions in the semiconductor substrate to define an active device substrate region therebetween;

(b) forming a layer of gate silicon oxide or a surface of the active device substrate region;

(c) forming a layer of polysilicon and the underlying layer of gate silicon oxide to define a polysilicon gate of the MOS transistor, the polysilicon gate being separated from the silicon substrate by underlying a region of gate silicon oxide, and to expose source/drain regions of the active device substrate region;

(e) performing a low density diffusion step, thereby introducing first N-type dopant into the source/drain regions;

(f) forming sidewall spaces on sidewalls of the polysilicon gate and the region of gate silicon oxide;

(g) performing an ion implant step, thereby introducing second N-type dopant into the source/drain regions and into the polysilicon gate such that the polysilicon gate is amorphized;

(h) forming a layer of silicon oxide over the structure resulting from step (g);

(i) performing a chemical mechanical polishing (CMP) step to expose an upper surface of the amorphized polysilicon gate;

(j) forming a layer of phosphorous oxychloride ($POCl_3$) over the structure resulting from step (i);

(k) thermally annealing the layer of $POCl_3$ to drive phosphorous from the layer of $POCl_3$ into the amorphized polysilicon gate;

(l) removing the layer of $POCl_3$;

(m) forming a layer of dielectric material over the structure resulting from step (l);

(n) forming contact openings in the structure resulting from step (m) to expose an upper surface of the source/drain regions and of the polysilicon gate;

(o) forming a metallization layer over the structure resulting from step (n) such that the metallization layer extends into the contact openings to form electrical contact with the exposed upper surface of the source/drain regions and of the polysilicon gate.

3. A method as in claim 2 and wherein the following steps are performed between step (l) and step (m):

forming a layer of titanium over the structure resulting from step (l);

performing a first anneal step at a first temperature to form a first phase silicon on the polysilicon gate;

removing unreacted titanium;

performing a second anneal step at a second temperature higher than the first temperature to form a second phase silicide on the polysilicon gate.

* * * * *

UNITED STATES PATENT AND TRADEMARK OFFICE
CERTIFICATE OF CORRECTION

PATENT NO.: 5,843,834
DATED: December 1, 1998
INVENTOR(S): Abdalla A. Naem

It is certified that an error appears in the above-identified patent and that said Letters Patent is hereby corrected as shown below:

In Col. 4, line 64, delete "or" and replace with --on--.

Signed and Sealed this

Ninth Day of March, 1999

Attest:

Q. TODD DICKINSON

Attesting Officer

Acting Commissioner of Patents and Trademarks